United States Patent [19]

Vogt

[11] 4,041,523

[45] Aug. 9, 1977

[54] CONTROLLABLE SEMICONDUCTOR COMPONENT HAVING MASSIVE HEAT DISSIPATING CONICALLY SHAPED METAL BODIES

[75] Inventor: Herbert Vogt, Munich, Germany

[73] Assignee: Siemens Aktiengesellschaft, Berlin & Munich, Germany

[21] Appl. No.: 691,622

[22] Filed: June 1, 9176

[30] Foreign Application Priority Data

June 6, 1975 Germany ............................ 2525390

[51] Int. Cl.² ............... H01L 23/28; H01L 23/02; H01L 23/12; H01L 23/42
[52] U.S. Cl. ............................................ 357/72; 357/74; 357/79; 357/81
[58] Field of Search ................. 357/72, 74, 79, 81

[56] References Cited

U.S. PATENT DOCUMENTS

| 3,513,361 | 5/1970 | Meyerhoff | 357/79 |
| 3,525,910 | 8/1970 | Philips | 357/79 |
| 3,636,419 | 1/1972 | Raithel et al. | 357/79 |
| 3,962,719 | 6/1976 | Pfaff | 357/74 |

FOREIGN PATENT DOCUMENTS 2,250,753  5/1973  Germany ............................ 357/72

Primary Examiner—Andrew J. James
Attorney, Agent, or Firm—Hill, Gross, Simpson, Van Santen, Steadman, Chiara & Simpson

[57] ABSTRACT

A controllable semiconductor component element has a housing of two massive metal bodies, each of which has a flange which is axially and radially embraced by an insulating ring. A semiconductor element is mounted between the metal bodies and has a cathode side and an anode side carrying a cathode and an anode, respectively which are conductively connected, with respect to heat and current, to the respective metal bodies. The anode is in the form of a ring which circumscribes a control electrode. A lead is connected to the control electrode and extends through an axial opening in the cathode side metal body to the exterior for connection, by way of spring tension, solder or the like to a control lead. The opening is completely filled with an insulating material to center and rigidly fix the lead therein. Each of the metal bodies is conically shaped, tapering away from the semiconductor element, and includes a rounded end to be received in a pressure spring.

8 Claims, 4 Drawing Figures

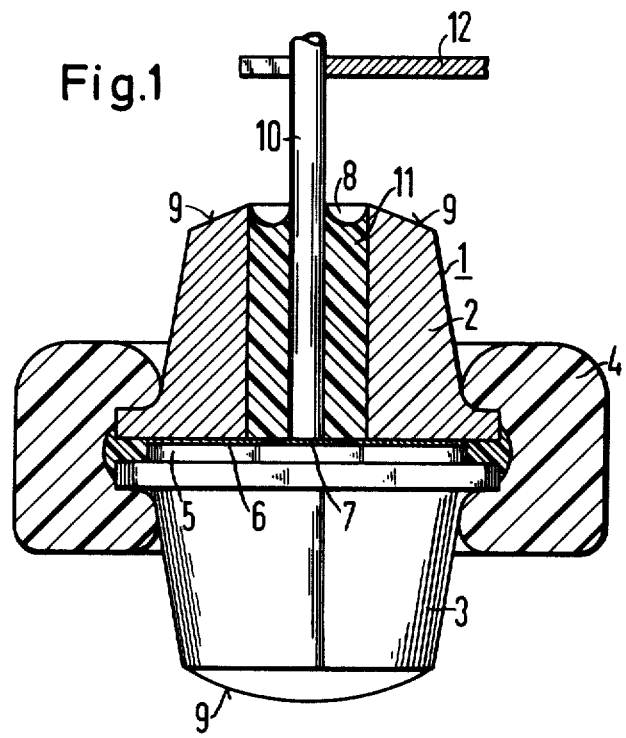

4,041,523

CONTROLLABLE SEMICONDUCTOR COMPONENT HAVING MASSIVE HEAT DISSIPATING CONICALLY SHAPED METAL BODIES

BACKGROUND OF THE INVENTION

1. Field of the Invention

The present invention relates to a controllable semiconductor component, and more particularly to such a component which has a housing consisting of two massive metal bodies which are surrounded at edge flanges by an insulation ring, and a semiconductor element mounted between the bodies having a cathode on one side and an anode on the other side connected to the respective bodies in a heat and current conductive relationship, and in which the cathode is ring-shaped and surrounds a control electrode to which a control lead is attached and extends through the cathode side metal body in a fixed and insulated manner.

2. Description of the Prior Art

Semiconductor components of the type generally described above have been known for quite some time. The two massive metal bodies in such semiconductor components are generally formed by two copper discs which are connected, for example, by soldering or welding at their edges, by a ceramic ring. In these disc-shaped semiconductor components, a lead for the control electrode is generally extended to the exterior by way of the insulating ring. On the exterior of the ring a plug socket is generally provided or, for example, a contact is provided in the form of a leaf spring which can be connected to a feed line. These known contacts of the control electrode to a feed line located outside of the housing are relatively expensive, since they must be accomplished manually. In addition, the lead must be installed asymmetrically, that is in a definite, targeted manner. In addition, great expense is necessary with regard to the installation, since the lead must not only be insulated with the housing, but must also be extended through the insulation ring in an insulated and gas-tight fashion. This expense appears tolerable for large thyristors, but is often, for reasons of cost, intolerable for small components which must be produced and installed in large quantities.

SUMMARY OF THE INVENTION

The object of the present invention therefore resides in the provision of a controllable semiconductor component of the type generally mentioned above, in which a simple contacting of the lead for the control electrode to an exterior feed line is possible.

A feature of the present invention resides in the fact that the cathode side metal body is provided with a central recess or opening, that the lead is essentially rigidly constructed and is situated in the central opening, and that the lead projects beyond the cathode side metal body to the exterior of the component.

An advantage of the invention is that the position of the lead is independent of the position at which a certain point on the circumference of the housing is located. As a result of the fact that the lead is essentially rigidly constructed, it is even possible to then carry out the contacting of the lead by machine, rather than by hand.

Advantageously, the above-mentioned central opening is completely filled with an insulating material. The mentioned simple contacting can be expediently carried out by means of a slotted metal clip lying at least approximately at right angles to the lead and provided with a notch for receiving the lead. The lead can, however, also be contacted by soldering or by a pressure spring.

BRIEF DESCRIPTION OF THE DRAWING

Other objects, features and advantages of the invention, its organization, construction and operation will be best understood from the following detailed description taken in conjunction with the accompanying drawing, on which:

FIG. 1 is an elavational view, partially in section, of a controllable semiconductor component constructed in accordance with the present invention;

FIG. 2 illustrates an advantageous embodiment of the exterior contacting of the lead of the component illustrated in FIG. 1;

FIG. 3 illustrates another advantageous embodiment of the exterior contacting of the lead of the component illustrated in FIG. 1; and FIG. 4 illustrates a further advantageous embodiment of the exterior contacting of the lead of the component illustrated in FIG. 1.

DESCRIPTION OF THE PREFERRED EMBODIMENT

In FIG. 1, a controllable semiconductor component is generally illustrated at 1 as comprising an upper massive metal body 2 and a lower massive metal body 3. Each of the metal bodies 2 and 3 comprises a conductive material, with respect to electrical and heat conduction, which may be, for example, copper. Each of the metal bodies is provided with a circumferential flange which is embraced, both radially and axially, this is circumferentially and radially of the entire component, by an insulating ring 4. The insulating ring 4 comprises, for example, a synthetic material which is sprayed on, melted on, shrunk on or cast. Between the metal bodies 2 and 3 is disposed a semiconductor element 5, having a cathode electrode 6 and a control electrode 7. The cathode electrode 6 surrounds and is insulated from the control electrode 7. An anode electrode (not shown) is disposed on the opposite side of the semiconductor body and is electrically connected to the lower massive metal body 3.

The upper metal body 2 is provided with a central opening 8 in which a lead 10 is centrally situated along the longitudinal axis of the component. The lead 10 rests upon the control electrode 7 and is connected thereto in a suitable manner, for example by welding, soldering or alloying. The upper metal body 2 rests upon the cathode electrode 6 and is connected thereto by suitable means, such as by soldering, alloying or welding.

Special advantages result from the parts being connected to one another by alloying or soldering. In the process, the semiconductor element 5 can be alloyed to or soldered onto the lower metat body 3 and, at the same time, the lead 10 and the upper metal body 2.

The opening 8 is filled with a synthetic insulating material 11, or with glass, which prevents an entry of the outer atmosphere into the interior of the housing. In addition, the material 11 serves to rigidly fix the lead 10 in position. To that end, the opening 8 is expediently completely filled with synthetic material or glass.

The lead 10 projects above the upper metal body 2 and is contacted there by a feed line 12. The feed line can, for example, consist of a sheet metal clip (FIG. 2)

which is provided with a cutout 13 into which the lead 10 fits. Further, the clip includes a V-shaped notch 14 so that the clip can be pushed onto the lead 10, whereupon the notch then opens up sufficiently for the lead 10 to slip into the cutout 13. The sheet metal clip then snaps shut to establish a good electrical and mechanical contact.

Since the lead 10 is essentially rigidly constructed, other kinds of connections to a feed line can also be selected. For example, it is possible to connect the lead 10 to a feed line 12 by an immersion soldering process. The lead 10 and the feed line is thus connected by a portion of solder 15 (FIG. 3). The feed line can, for example, be part of a printed circuit or be mounted on a carrier plate. The contact with the feed line can also be established by a pressure spring 16, which rests upon the lead 10 (FIG. 4).

The invention is especially advantageously applicable in connection with controlled rectifier bridges in which, as is well known in the art, four or six components each are employed. These can simultaneously be connected to one carrier which bears four or, respectively, six leads. The invention can find application just as well in connection with semicontrolled bridges, which, in each case, only half the components are embodied as controllable components. The feed-in or, respectively, discharge of the load current of the controllable semiconductor components occurs by way of the metal bodies 2 and 3. These can, as depicted in the drawing, taper conically away from the semiconductor element 5 and be installed in correspondingly conically constructed recesses of bus bars or cooling bodies serving as bus bars. The position of a point on the circumference of the semiconductor element in relation to a point on the circumference of the opening is unimportant because of the rotation symmetry of the semiconductor component.

The metal bodies 2 and 3 can also have a cylindrical form. These bodies can also have seating portions 9 to be received in springs by which the metal bodies are pressed against the cooling bodies. The seating portions are preferably constructed in such a manner that as central a contact pressure as possible is guaranteed. In the exemplary embodiment illustrated in FIG. 1, the seating location is constructed with a spherical shape. In case the control electrode and the metal bodies only rest on the semiconductor element, without being connected thereto by soldering or alloying, these springs or a single spring can supply the necessary inner contact pressure for several component elements.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A controllable semiconductor component for mounting in conically shaped recesses, said component comprising:
   a semiconductor element including a ring-shaped cathode on one side, an anode on the opposite side and a control electrode within said ring-shaped cathode;
   a housing including a pair of massive metal bodies on respective sides of said semiconductor element connected to said cathode and said anode, respectively, in a heat and electric conductive relationship, said metal body on said cathode side including a central opening therethrough, and an insulating ring securing and sealing said bodies in the area of contact with said semiconductor element, each of said metal bodies comprising a conical shape tapering in the direction away from said semiconductor element for mounting in the conically shaped recesses; and
   a control lead electrically connected to said control electrode, said control lead extending through said opening to the exterior of housing and rigidly mounted in an insulated manner within said opening.

2. the component of claim 1, comprising: insulating material filling said opening to rigidly mount said control lead.

3. The component of claim 1, wherein at least one of said metal bodies comprises a seating portion for receiving a pressure spring.

4. The component of claim 1, in combination with a feed line, wherein the distal end of said control lead is soldered to said feed line.

5. The component of claim 1, in combination with a pressure spring and a feed line connected to said pressure spring, wherein said control lead is in engagement with said pressure spring.

6. The component of claim 1, in combination with a feed line and a metal clip attached to said feed line, said metal clip including a notch for receiving said control lead.

7. The component of claim 6, wherein said clip extends at right angles to said control leads and includes resilient legs extending to said notch to flexibly receive said control lead.

8. A controllable semiconductor component for mounting in conically shaped recesses, said component comprising:
   a semiconductor element including a centrally located control electrode on one side, an anode on the other side, and a cathode spaced from and on the same side as said control electrode;
   a pair of conically shaped metal bodies, one of said bodies connected said cathode and tapering away for said semiconductor element, the other of said bodies connected to said anode and tapering away from said semiconductor element, each of said bodies provided with the conical shape for receipt in the conical recesses, said one body having a central opening aligned with said control electrode, at each of said bodies including a circumferential flange adjacent the like flange of the other;
   an insulating ring embracing said flanges to seal and secure said bodies;
   a control lead extending from the exterior of said component through said opening and contacting said control electrode; and
   a vitreous filling in said opening rigidly securing said control lead and sealing said opening.

* * * * *